(12) United States Patent
Tao et al.

(10) Patent No.: US 11,456,045 B2
(45) Date of Patent: Sep. 27, 2022

(54) SHIFT REGISTER, DRIVING METHOD THEREOF, GATE DRIVING CIRCUIT, AND DISPLAY APPARATUS

(71) Applicants: BOE TECHNOLOGY GROUP CO., LTD., Beijing (CN); Hefei BOE Optoelectronics Technology Co., Ltd., Anhui (CN)

(72) Inventors: Jian Tao, Beijing (CN); Li Sun, Beijing (CN); Wei Xue, Beijing (CN); Hongmin Li, Beijing (CN)

(73) Assignees: BEIJING BOE TECHNOLOGY DEVELOPMENT CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 305 days.

(21) Appl. No.: 15/934,833

(22) Filed: Mar. 23, 2018

(65) Prior Publication Data

US 2019/0115090 A1    Apr. 18, 2019

(30) Foreign Application Priority Data

Oct. 18, 2017  (CN) .......................... 201710969941.X

(51) Int. Cl.
*G11C 19/00*  (2006.01)
*G11C 19/28*  (2006.01)
*G09G 3/20*  (2006.01)

(52) U.S. Cl.
CPC ............. *G11C 19/287* (2013.01); *G09G 3/20* (2013.01); *G11C 19/28* (2013.01); *G09G 2300/0408* (2013.01); *G09G 2310/0286* (2013.01); *G09G 2310/08* (2013.01)

(58) Field of Classification Search
None
See application file for complete search history.

(56) References Cited

U.S. PATENT DOCUMENTS 7,317,779 B2 * 1/2008  Moon ....................... G09G 3/20
                                                       345/100
8,107,586 B2 * 1/2012  Shin ........................ G11C 19/28
                                                         377/64
8,330,492 B2 * 12/2012 Umezaki ............. H01L 27/1222
                                                        326/102

(Continued)

*Primary Examiner* — Tuan T Lam
(74) *Attorney, Agent, or Firm* — Kinney & Lange, P.A.

(57) ABSTRACT

The embodiments of the present disclosure propose a shift register, a driving method thereof, a gate driving circuit and a display apparatus. The shift register comprises an input sub-circuit coupled to an input terminal and a pull-up node, and configured to charge the pull-up node under control of an input signal from the input terminal; an output sub-circuit coupled to a clock signal terminal, the pull-up node, and an output terminal, and configured to transmit a clock signal from the clock signal terminal to the output terminal under control of the pull-up node; and an output shaping sub-circuit coupled to the clock signal terminal, the output terminal, and a first voltage signal terminal, and configured to transmit a first voltage signal from the first voltage signal terminal to the output terminal under control of the clock signal.

20 Claims, 4 Drawing Sheets

(56) References Cited

U.S. PATENT DOCUMENTS

| | | | | |
|---|---|---|---|---|
| 8,331,524 B2* | 12/2012 | Hsu | ............... | G11C 19/00 |
| | | | | 377/64 |
| 8,442,621 B2* | 5/2013 | Gorek | ............... | A61B 17/7091 |
| | | | | 600/424 |
| 8,842,061 B2* | 9/2014 | Chen | ............... | G11C 19/28 |
| | | | | 345/100 |
| 9,824,771 B2* | 11/2017 | Cho | ............... | G11C 19/28 |
| 2003/0231735 A1* | 12/2003 | Moon | ............... | G11C 19/28 |
| | | | | 377/64 |
| 2004/0046729 A1* | 3/2004 | Moon | ............... | G09G 3/3677 |
| | | | | 345/100 |
| 2007/0217564 A1* | 9/2007 | Tobita | ............... | G11C 19/28 |
| | | | | 377/64 |
| 2008/0101529 A1* | 5/2008 | Tobita | ............... | G11C 19/28 |
| | | | | 377/64 |
| 2012/0256817 A1* | 10/2012 | Chen | ............... | G11C 19/28 |
| | | | | 345/92 |
| 2014/0086379 A1* | 3/2014 | Ma | ............... | G11C 19/28 |
| | | | | 377/64 |
| 2014/0219412 A1* | 8/2014 | Chien | ............... | G11C 19/28 |
| | | | | 377/68 |
| 2015/0043703 A1* | 2/2015 | Tan | ............... | G11C 19/28 |
| | | | | 377/68 |
| 2015/0302935 A1* | 10/2015 | Zeng | ............... | G09G 3/20 |
| | | | | 377/64 |
| 2016/0012911 A1* | 1/2016 | Han | ............... | G09G 3/20 |
| | | | | 377/64 |
| 2016/0307641 A1* | 10/2016 | Zheng | ............... | G09G 3/3677 |
| 2017/0039987 A1* | 2/2017 | Yao | ............... | G09G 3/30 |
| 2018/0108426 A1* | 4/2018 | Zheng | ............... | H01L 27/1251 |
| 2018/0268914 A1* | 9/2018 | Zhao | ............... | G11C 19/18 |
| 2019/0206503 A1* | 7/2019 | Zhang | ............... | G09G 3/3677 |

* cited by examiner

SHIFT REGISTER, DRIVING METHOD THEREOF, GATE DRIVING CIRCUIT, AND DISPLAY APPARATUS

CROSS-REFERENCE TO RELATED APPLICATION(S)

This application claims priority to the Chinese Patent Application No. 201710969941.X, filed on Oct. 18, 2017, which is incorporated herein by reference in its entirety.

TECHNICAL FIELD

The present disclosure relates to the field of display technology, and more particularly, to a shift register, a driving method thereof, a gate driving circuit and a display apparatus.

BACKGROUND

With the popularity of Liquid Crystal Display (LCD) and Organic Light Emitting Diode (OLED) technologies, the gate driving technology, which is one of common key technologies for both of the display technologies, has naturally become a focus of attention. At present, the Gate Driver on Array (GOA for short) technology is generally used, which directly makes a gate driving circuit on an array substrate together with a Thin Film Transistor (TFT) array. The GOA technology can be applied to directly make the gate driving circuit surrounding a panel, thereby reducing the procedure complexity and the product cost. In addition, the GOA technology can be applied to improve integration of the display panel, so that the panel is further thinned, and design of a narrow bezel can be realized.

SUMMARY

According to some embodiments of the present disclosure, there are provided a shift register, a driving method thereof, a gate driving circuit and a display apparatus.

According to an aspect, the embodiments of the present disclosure provide a shift register. The shift register comprises: an input sub-circuit coupled to an input terminal and a pull-up node, and configured to charge the pull-up node under control of an input signal from the input terminal; an output sub-circuit coupled to a clock signal terminal, the pull-up node, and an output terminal, and configured to transmit a clock signal from the clock signal terminal to the output terminal under control of the pull-up node; and an output shaping sub-circuit coupled to the clock signal terminal, the output terminal, and a first voltage signal terminal, and configured to transmit a first voltage signal from the first voltage signal terminal to the output terminal under control of the clock signal.

In some embodiments, the output shaping sub-circuit comprises a first transistor, a second transistor and a third transistor, wherein the first transistor has a control terminal coupled to the clock signal terminal, a first terminal coupled to a control terminal of the second transistor, and a second terminal coupled to the first voltage signal terminal; the second transistor has the control terminal further coupled to a second terminal of the third transistor, a first terminal coupled to the first voltage signal terminal, and a second terminal coupled to the output terminal; and the third transistor has a control terminal and a first terminal coupled to a second voltage signal terminal. In some embodiments, the shift register further comprises: a reset sub-circuit coupled to a reset signal terminal, the pull-up node, and the first voltage signal terminal, and configured to provide the first voltage signal from the first voltage signal terminal to the pull-up node under control of a reset signal from the reset signal terminal; a pull-up node control sub-circuit coupled to the pull-up node, a pull-down node and the first voltage signal terminal, and configured to provide the first voltage signal from the first voltage signal terminal to the pull-up node under control of the pull-down node; a pull-down control sub-circuit coupled to the pull-down node, the first voltage signal terminal and the output terminal, and configured to provide the first voltage signal from the first voltage signal terminal to the output terminal under control of the pull-down node; a first pull-down node control sub-circuit coupled to the pull-down node and a second voltage signal terminal, and configured to provide a second voltage signal from the second voltage signal terminal to the pull-down node; and a second pull-down node control sub-circuit coupled to the pull-up node, the pull-down node, and the first voltage signal terminal, and configured to provide the first voltage signal from the first voltage signal terminal to the pull-down node under control of the pull-up node.

In some embodiments, the input sub-circuit comprises: a fourth transistor having a control terminal and a first terminal coupled to the input terminal, and a second terminal coupled to the pull-up node. In some embodiments, the reset sub-circuit comprises: a fifth transistor having a control terminal coupled to the reset signal terminal, a first terminal coupled to the pull-up node, and a second terminal coupled to the first voltage signal terminal. In some embodiments, the output sub-circuit comprises a sixth transistor and a first capacitor, wherein the sixth transistor has a control terminal coupled to the pull-up node, a first terminal coupled to the clock signal terminal, and a second terminal coupled to the output terminal; and the first capacitor has a first terminal coupled to the pull-up node, and a second terminal coupled to the output terminal. In some embodiments, the pull-up node control sub-circuit comprises: a seventh transistor having a control terminal coupled to the pull-down node, a first terminal coupled to the pull-up node, and a second terminal coupled to the first voltage signal terminal. In some embodiments, the pull-down control sub-circuit comprises: an eighth transistor having a control terminal coupled to the pull-down node, a first terminal coupled to the output terminal, and a second terminal coupled to the first voltage signal terminal. In some embodiments, the first pull-down node control sub-circuit comprises a ninth transistor and a tenth transistor, wherein the ninth transistor has a control terminal coupled to a second terminal of the tenth transistor, a first terminal coupled to the second voltage signal terminal, and a second terminal coupled to the pull-down node; and the tenth transistor has a control terminal and a first terminal coupled to the second voltage signal terminal. In some embodiments, the second pull-down node control sub-circuit comprises an eleventh transistor and a twelfth transistor, wherein the eleventh transistor has a control terminal coupled to the pull-up node, a first terminal coupled to the pull-down node, and a second terminal coupled to the first voltage signal terminal; and the twelfth transistor has a control terminal coupled to the pull-up node, a first terminal coupled to the control terminal of the ninth transistor, and a second terminal coupled to the first voltage signal terminal. In some embodiments, all of the transistors are N-type transistors, the first voltage signal is a low level signal and the second voltage signal is a high level signal.

According to another aspect, the embodiments of the present disclosure provide a driving method of a shift register. The method comprises: in a first phase, charging, by the input sub-circuit, the pull-up node under control of an input signal; in a second phase, transmitting, by the output sub-circuit, a clock signal to the output terminal under control of the pull-up node; and in a third phase, transmitting, by the output shaping sub-circuit, a first voltage signal to the output terminal under control of the clock signal.

In some embodiments, a sum of the first phase, the second phase, and the third phase is approximately equal to one clock cycle.

According to yet another aspect, the embodiments of the present disclosure provide a gate driving circuit. The gate driving circuit comprises a plurality of cascaded shift registers described above.

According to a further aspect, the embodiments of the present disclosure provide a display apparatus. The display apparatus comprises the gate driving circuit described above.

BRIEF DESCRIPTION OF THE DRAWINGS

The above and other purposes, features and advantages of the present disclosure will be more apparent from the following description of the preferred embodiments of the present disclosure with reference to the accompanying drawings, in which.

DETAILED DESCRIPTION

Figure 1:
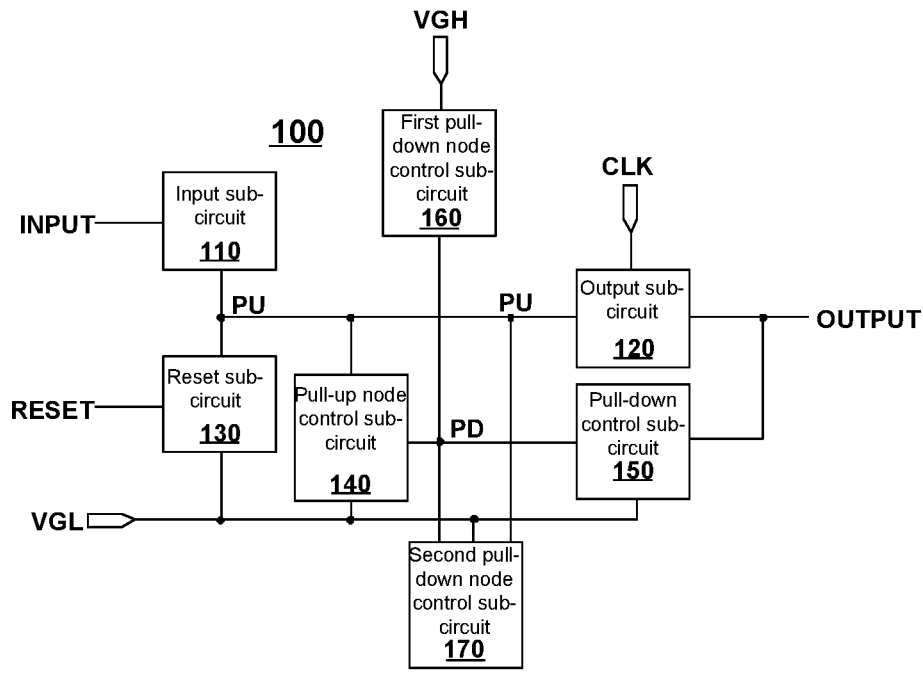
FIG. 1 is a diagram illustrating an exemplary structure of a shift register according to an embodiment of the present disclosure.

A part of the embodiments of the present disclosure will be described in detail below with reference to the accompanying drawings, in which details and functions which are not necessary for the present disclosure are omitted in the description in order to prevent confusion in the understanding of the present disclosure. In the present specification, the following description of various embodiments for describing the principles of the present disclosure is illustrative only and should not be construed as limiting the scope of the disclosure in any way. The following description of the drawings, with reference to the accompanying drawings, is provided to assist in a comprehensive understanding of the example embodiments of the disclosure as defined by the claims and their equivalents. The following description includes many specific details to assist in the understanding, but such details are to be regarded as merely exemplary. Accordingly, those of ordinary skill in the art will recognize that numerous changes and modifications can be made to the embodiments described herein without departing from the scope and spirit of the present disclosure. In addition, descriptions of well-known functions and structures are omitted for clarity and conciseness. In addition, the same reference numerals are used for the same or similar functions, devices and/or operations throughout the accompanying drawings. Further, in the accompanying drawings, various parts are not necessarily drawn to scale. In other words, relative sizes, lengths etc. of the various parts in the accompanying drawings do not necessarily correspond to actual ratios.

In the present disclosure, terms "include" and "contain" and their derivatives are intended to be inclusive and not restrictive, and the term "or" is inclusive, meaning and/or. In addition, in the following description of the present disclosure, oriental terms which are used such as "up," "down," "left," "right," etc. are used to indicate relative positional relationships to assist those skilled in the art in understanding the embodiments of the present disclosure. Therefore, those skilled in the art should understand that "up"/"down" in one direction may be changed to "down"/"up" in an opposite direction and may be changed to another positional relationship in another direction, such as "left"/"right" etc.

The present disclosure will be descried in detail below by taking application of the embodiments of the present disclosure to a gate driving circuit of a display apparatus as an example. However, it should be understand by those skilled in the art that the application field of the present disclosure is not limited thereto. In fact, the shift register etc. according to the embodiment of the present disclosure can be applied in other fields in which the shift register is required to be used.

In addition, although description has been made by taking the transistors being N-type transistors as an example in the following description, the present disclosure is not limited thereto. In fact, it can be understood by those skilled in the art that the technical solutions according to the present application can also be implemented when one or more of various transistors mentioned below are P-type transistors, and it only needs to adjust setting of levels correspondingly.

A gate driving circuit generally employs a structure formed by a plurality of cascaded shift registers, wherein each shift register may comprise a plurality of constituent sub-circuits which operate cooperatively to realize an input-output shift function of the shift register. For example, FIG. 1 is a diagram illustrating an exemplary structure of a shift register 100 according to an embodiment of the present disclosure. As shown in FIG. 1, the shift register 100 may comprise an input sub-circuit 110, an output sub-circuit 120, a reset sub-circuit 130, a pull-up node control sub-circuit 140, a pull-down control sub-circuit 150, a first pull-down node control sub-circuit 160 and a second pull-down node control sub-circuit 170. However, the present disclosure is not limited thereto. In fact, one or more of these sub-circuits may be omitted, or other sub-circuits may be newly added, or various sub-circuits may be modified, or any combination thereof, which falls within the protection scope of the present disclosure.

As shown in FIG. 1, the input sub-circuit 110 may be coupled to an input terminal INPUT and a pull-up node PU, and may be configured to provide an input signal from the input terminal INPUT to the pull-up node PU. The output sub-circuit 120 may be coupled to a clock signal terminal CLK, the pull-up node PU, and an output terminal OUTPUT, and may be configured to provide a clock signal from the clock signal terminal CLK to the output terminal OUT- PUT under control of the pull-up node PU. The reset sub-circuit 130 may be coupled to a reset signal terminal RESET, the pull-up node PU and a first voltage signal terminal VGL, and may be configured to provide a first voltage signal from the first voltage signal terminal VGL to the pull-up node PU under control of a reset signal from the reset signal terminal RESET. The pull-up node control sub-circuit 140 may be coupled to the pull-up node PU, a pull-down node PD and the first voltage signal terminal VGL, and may be configured to provide the first voltage signal from the first voltage signal terminal VGL to the pull-up node PU under control of the pull-down node PD. The pull-down control sub-circuit 150 may be coupled to the pull-down node PD, the first voltage signal terminal VGL and the output terminal OUTPUT, and may be configured to provide the first voltage signal from the first voltage signal terminal VGL to the output terminal OUTPUT under control of the pull-down node PD. The first pull-down node control sub-circuit 160 may be coupled to the pull-down node PD and a second voltage signal terminal VGH, and may be configured to provide a second voltage signal from the second voltage signal terminal VGH to the pull-down node PD. The second pull-down node control sub-circuit 170 may be coupled to the pull-up node PU, the pull-down node PD and the first voltage signal terminal VGL, and may be configured to provide the first voltage signal from the first voltage signal terminal VGL to the pull-down node PD under control of the pull-up node PU.

An operation timing of the shift register 100 in a case of a clock signal with a duty cycle less than 50% will be described in detail below with reference to FIG. 2.

Figure 2:
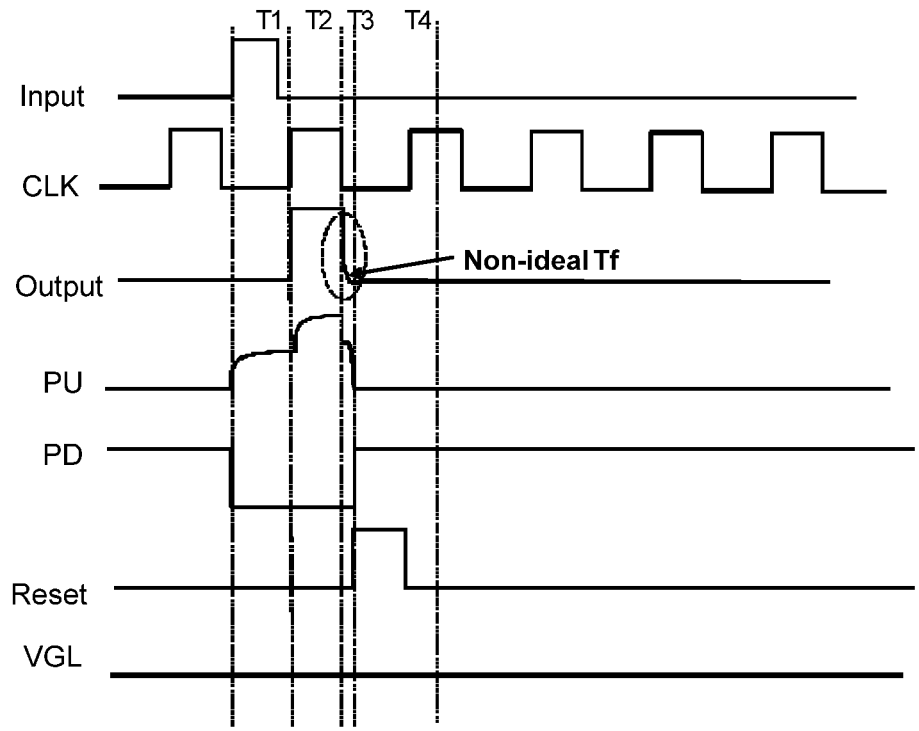
FIG. 2 is a diagram illustrating an exemplary operation timing of the shift register shown in FIG. 1.

FIG. 2 illustrates a diagram of an exemplary operation timing of the shift register 100. For example, all of transistors included in the shift register 100 may be N-type transistors; however, the present disclosure is not limited thereto. As shown in FIG. 2, in a first phase T1, the input terminal INPUT of the shift register 100 receives a Start Vertical (STV for short) signal or an output signal from a previous stage of shift register, to charge the pull-up node PU. As a level at the pull-up node PU increases, a level at the pull-down node PD decreases. At this time, as a clock signal at a low level is input to the clock signal terminal CLK, in a case that the output sub-circuit is turned on by the high level at the pull-up node PU, the clock signal at a low level from the clock signal terminal CLK is output to the output terminal OUTPUT.

In a second phase T2, an input signal at a low level is input to the input terminal INPUT, and a clock signal at a high level is input to the clock signal terminal CLK. At this time, as the output terminal OUTPUT becomes outputting the clock signal at a high level, a second terminal of a capacitor in the output sub-circuit 120 which is coupled to the output terminal OUTPUT also becomes a high level. At this time, due to the bootstrap action of the capacitor, a voltage at a first terminal of the capacitor may further increase, so that the voltage at the pull-up node PU further increases, and thereby the clock signal at a high level continues to be output by the output terminal OUTPUT.

In a third phase T3, an input signal at a low level is input to the input terminal INPUT, and a clock signal at a low level is input to the clock signal terminal CLK. At this time, as the output terminal OUTPUT becomes outputting the clock signal at a low level, the second terminal of the capacitor which is coupled to the output terminal OUTPUT also becomes a low level. At this time, as the bootstrap action of the capacitor disappears, the voltage at the first terminal of the capacitor may drop steeply, which results in that the output sub-circuit 120 cannot be completely turned on. Therefore, in this case, the output terminal OUTPUT cannot be rapidly pulled down to a low level by the clock signal.

In a fourth phase T4, an input signal at a low level is input to the input terminal INPUT, and a clock signal is input to the clock signal terminal CLK. At this time, the reset sub-circuit 130 is turned on by the reset signal from the reset signal terminal RESET, so that the level at the pull-up node PU decreases, and thereby the pull-down node PD becomes a high level to turn on the pull-down control sub-circuit 150, and finally pull down the output signal from the output terminal OUTPUT to a low level. In remaining time of one frame, or in other words, before an input signal at a high level arrives in a next frame, as the pull-up node PU may no longer be pulled up, the output signal will always remain at a low level.

As shown in FIG. 2, due to the use of a clock signal with a duty cycle less than 50% (for example, a clock signal with a duty cycle equal to 45%), a falling edge of the clock signal (for example, at the end of the T2 phase) is not coincident with a rising edge of the reset signal (for example, at the end of the T3 phase), which results in insufficient de-noising of the output signal in the T3 phase, for example, within 5% of a cycle (as described above in connection with the third phase T3 of FIG. 2).

In fact, as shown in the embodiment of FIG. 2, the shift register 100 cannot sufficiently de-noise the output signal in a case that the duty cycle of the clock signal is less than 50%, which results in distortion of the falling edge of the output signal, and thereby easily causes errors in a display picture.

Therefore, in order to at least partially solve and/or mitigate the above problem, a shift register, a driving method thereof, a gate driving circuit, and a display apparatus according to some embodiments of the present disclosure are proposed. Compared with the aforementioned shift register, the shift register according to some embodiments of the present disclosure re-shapes the output signal thereof by introducing an output shaping sub-circuit, so that an output waveform thereof is more ideal. Therefore, the shift register according to some embodiments of the present disclosure and/or a gate driving circuit including the same are suitable for a clock signal with a duty cycle less than, for example, 50%. Additionally or alternatively, in some other embodiments, it is also applicable to a clock signal with a duty cycle equal to 50%.

In general, the shift register is configured to rapidly pull down a level (Tf) of the output signal in a period of time (for example, the T3 phase shown in FIG. 2) from the start of the falling edge of the clock signal (for example, at the end of the T2 phase shown in FIG. 2) to the arrival of the reset signal (for example, at the end of the T3 phase shown in FIG. 2), so that an effect of reducing sizes of transistors in the output sub-circuit 120 and GOE time and increasing the charging rate can be achieved. Here, the GOE time refers to the time from the start of a falling edge of a gate driving signal for a current row to a rising edge of a data driving signal for a next row. If the time is shortened, the charging time for the corresponding row may increase.

A shift register according to some other embodiments of the present disclosure will be described in detail below with reference to FIGS. 3-7.

Figure 3:
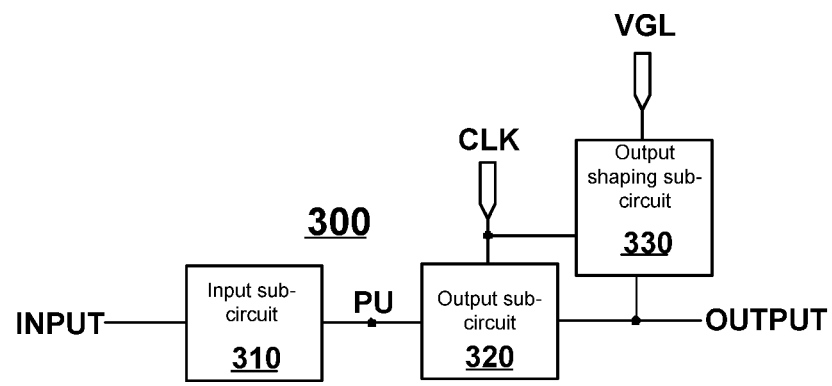
FIG. 3 is a diagram illustrating an exemplary structure of a shift register according to another embodiment of the present disclosure.

FIG. 3 is a diagram illustrating an exemplary structure of a shift register 300 according to another embodiment of the present disclosure. As shown in FIG. 3, the shift register 300 may comprise an input sub-circuit 310, an output sub-circuit 320, and an output shaping sub-circuit 330. In fact, one or more of these sub-circuits may be omitted, or other sub-circuits may be newly added, or various sub-circuits may be modified, or any combination thereof, which falls within the protection scope of the present disclosure.

As shown in FIG. 3, the input sub-circuit 310 may be coupled to an input terminal INPUT and a pull-up node PU, and may be configured to charge the pull-up node PU under control of an input signal from the input terminal INPUT. The output sub-circuit 320 may be coupled to a clock signal terminal CLK, the pull-up node PU, and an output terminal OUTPUT, and may be configured to transmit a clock signal from the clock signal terminal CLK to the output terminal OUTPUT under control of the pull-up node PU. In addition, as shown in FIG. 3, the output shaping sub-circuit 330 may be coupled to the clock signal terminal CLK, the output terminal OUTPUT, and a first voltage signal terminal VGL, and may be configured to transmit a first voltage signal from the first voltage signal terminal VGL to the output terminal OUTPUT under control of the clock signal.

The output shaping sub-circuit 330 may be configured to pull down the output signal directly to a low level signal of the first voltage signal terminal VGL at a falling edge of the clock signal (for example, at the end of the T2 phase shown in FIG. 7) without having to wait for the reset signal which arrives until the end of the T3 phase. As a result, the output signal is effectively de-noised, thereby preventing possible errors in a display picture.

Figure 4:
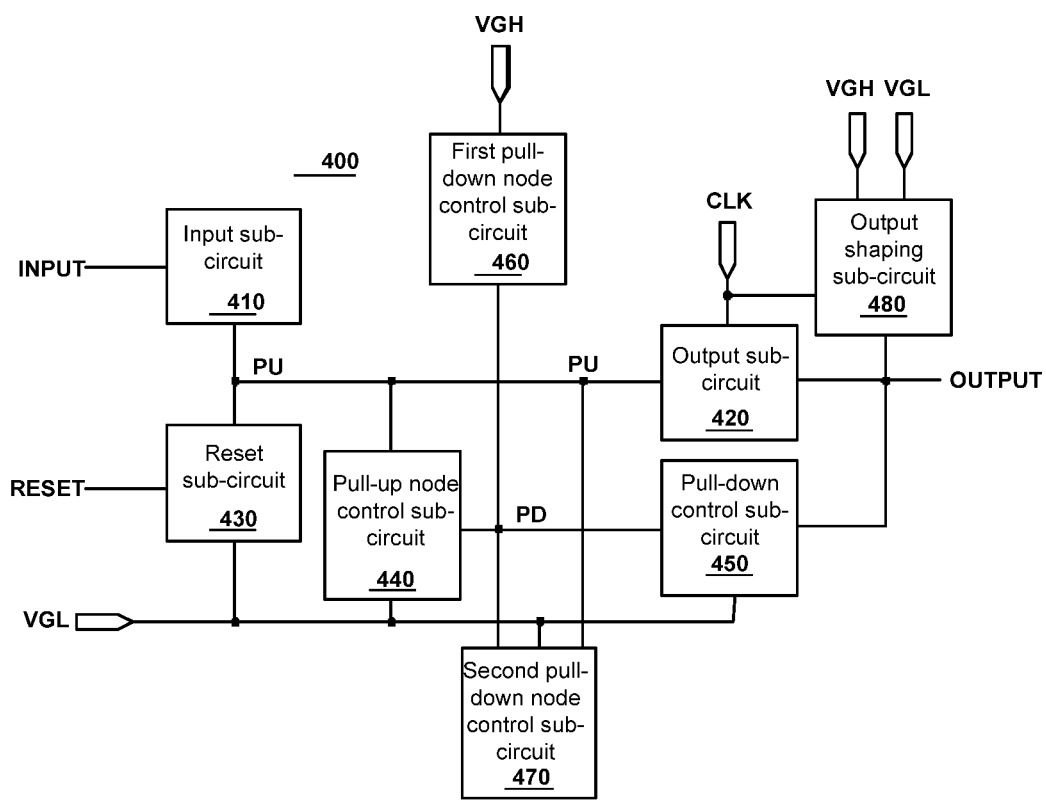
FIG. 4 is a diagram illustrating an exemplary structure of a shift register according to yet another embodiment of the present disclosure.

FIG. 4 is a diagram illustrating an exemplary structure of a shift register 400 according to another embodiment of the present disclosure. Compared to the embodiment shown in FIG. 1, the shift register 400 shown in FIG. 4 may further comprise an output shaping sub-circuit 480. Compared with the embodiment shown in FIG. 2, the shift register 400 shown in FIG. 4 may further comprise a reset sub-circuit 430, a pull-up node control sub-circuit 440, a pull-down control sub-circuit 450, a first pull-down node control sub-circuit 460, and a second pull-down node control sub-circuit 470. Therefore, as shown in FIG. 4, the shift register 400 may comprise an input sub-circuit 410, an output sub-circuit 420, the reset sub-circuit 430, the pull-up node control sub-circuit 440, the pull-down control sub-circuit 450, the first pull-down node control sub-circuit 460, the second pull-down node control sub-circuit 470, and the output shaping sub-circuit 480. In fact, one or more of these sub-circuits may be omitted, or other sub-circuits may be newly added, or various sub-circuits may be modified, or any combination thereof, which falls within the protection scope of the present disclosure.

As shown in FIG. 4, the input sub-circuit 410 may be coupled to an input terminal INPUT and a pull-up node PU, and may be configured to charge the pull-up node PU under control of an input signal from the input terminal INPUT. The output sub-circuit 420 may be coupled to a clock signal terminal CLK, the pull-up node PU, and an output terminal OUTPUT, and may be configured to transmit a clock signal from the clock signal terminal CLK to the output terminal OUTPUT under control of the pull-up node PU. In addition, as shown in FIG. 4, the output shaping sub-circuit 480 may be coupled to the clock signal terminal CLK, the output terminal OUTPUT, and a first voltage signal terminal VGL, and may be configured to transmit a first voltage signal from the first voltage signal terminal VGL to the output terminal OUTPUT under control of the clock signal.

In addition, as shown in FIG. 4, the reset sub-circuit 430 may be coupled to the reset signal terminal RESET, the pull-up node PU, and the first voltage signal terminal VGL, and may be configured to provide the first voltage signal from the first voltage signal terminal VGL to the pull-up node PU under control of a reset signal from the reset signal terminal RESET. The pull-up node control sub-circuit 440 may be coupled to the pull-up node PU, a pull-down node PD and the first voltage signal terminal VGL, and may be configured to provide the first voltage signal from the first voltage signal terminal VGL to the pull-up node PU under control of the pull-down node PD. The pull-down control sub-circuit 450 may be coupled to the pull-down node PD, the first voltage signal terminal VGL and the output terminal OUTPUT, and may be configured to provide the first voltage signal from the first voltage signal terminal VGL to the output terminal OUTPUT under control of the pull-down node PD. The first pull-down node control sub-circuit 460 may be coupled to the pull-down node PD and a second voltage signal terminal VGH, and may be configured to provide a second voltage signal from the second voltage signal terminal VGH to the pull-down node PD. The second pull-down node control sub-circuit 470 may be coupled to the pull-up node PU, the pull-down node PD and the first voltage signal terminal VGL, and may be configured to provide the first voltage signal from the first voltage signal terminal VGL to the pull-down node PD under control of the pull-up node PU.

The output shaping sub-circuit 480 may be configured to pull down the output signal directly to a low level signal of the first voltage signal terminal VGL at a falling edge of the clock signal (for example, at the end of the T2 phase shown in FIG. 7) without having to wait for the reset signal which arrives until the end of the T3 phase. As a result, the output signal is effectively de-noised, thereby preventing possible errors in a display picture.

Next, a structure of the shift register 400 according to the embodiment of the present disclosure will be described in more detail with reference to FIG. 5 in conjunction with FIG. 4.

Figure 5:
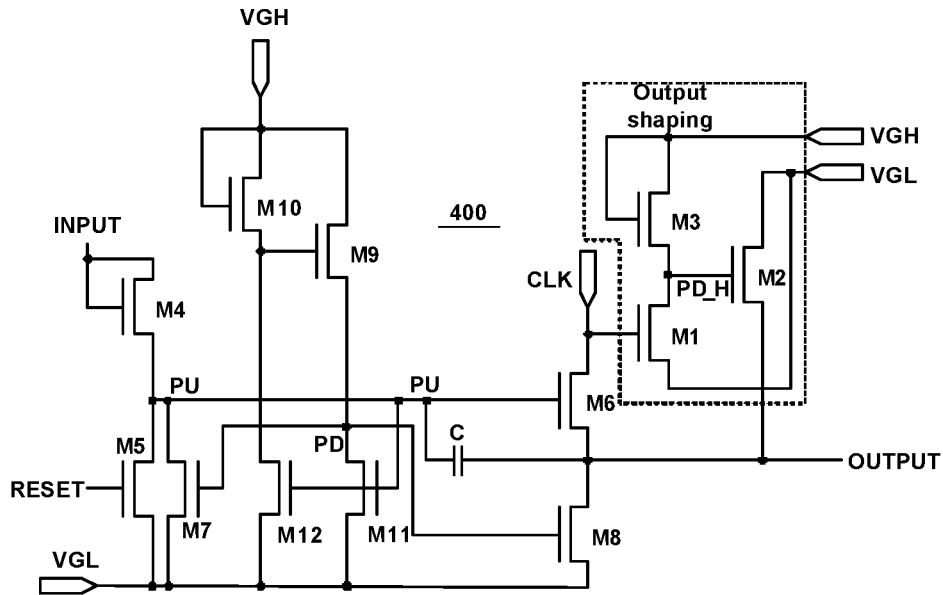
FIG. 5 is a diagram illustrating a specific configuration of the shift register shown in FIG. 4.

FIG. 5 is a diagram illustrating a specific structure of the shift register 400 shown in FIG. 4. As shown in FIG. 5, the output shaping sub-circuit 480 may comprise a first transistor M1, a second transistor M2, and a third transistor M3. The first transistor M1 may have a control terminal coupled to the clock signal terminal CLK, a first terminal coupled to a control terminal of the second transistor M2, and a second terminal coupled to the first voltage signal terminal VGL. The second transistor M2 may have the control terminal further coupled to a second terminal of the third transistor M3, a first terminal coupled to the first voltage signal terminal VGL, and a second terminal coupled to the output terminal OUTPUT. The third transistor M3 may have a control terminal and a first terminal coupled to the second voltage signal terminal VGH. In addition, a point at which the first terminal of the first transistor M1, the control terminal of the second transistor M2, and the second terminal of the third transistor M3 are coupled is referred to as a reference node PD_H. In a case of using a connection relationship shown in FIG. 5, it can be seen that the node PD_H is mainly controlled by the first transistor M1 when the clock signal is at a high level, and is mainly controlled by the third transistor M3 when the clock signal is at a low level. This is because a relative size relationship between turn-on resistances of the first transistor M1 and the third transistor M3 may be adjusted (by adjusting, for example, channel length-width ratios of the transistors), so that when the first transistor M1 is turned on, the turn-on resistance of the first transistor M1 is much less than that of the third transistor M3, and thereby the first transistor becomes a dominant factor in controlling the node PD_H.

In addition, in some embodiments, the input sub-circuit 410 may comprise a fourth transistor M4, wherein the fourth transistor M4 may have a control terminal and a first terminal coupled to the input terminal INPUT, and a second terminal coupled to the pull-up node PU. In some embodiments, the reset sub-circuit 430 may comprise a fifth transistor M5, wherein the fifth transistor M5 may have a control terminal coupled to the reset signal terminal RESET, a first terminal coupled to the pull-up node PU, and a second terminal coupled to the first voltage signal terminal VGL. In some embodiments, the output sub-circuit 420 may comprise a sixth transistor M6 and a first capacitor C. The sixth transistor M6 may have a control terminal coupled to the pull-up node PU, a first terminal coupled to the clock signal terminal CLK, and a second terminal coupled to the output terminal OUTPUT. The first capacitor C may have a first terminal coupled to the pull-up node PU, and a second terminal coupled to the output terminal OUTPUT. In some embodiments, the pull-up node control sub-circuit 440 may comprise a seventh transistor M7, wherein the seventh transistor M7 may have a control terminal coupled to the pull-down node PD, a first terminal coupled to the pull-up node PU, and a second terminal coupled to the first voltage signal terminal VGL. In some embodiments, the pull-down control sub-circuit 450 may comprise an eighth transistor M8, wherein the eighth transistor M8 may have a control terminal coupled to the pull-down node PD, a first terminal coupled to the output terminal OUTPUT, and a second terminal coupled to the first voltage signal terminal VGL. In some embodiments, the first pull-down node control sub-circuit 460 may comprise a ninth transistor M9 and a tenth transistor M10. The ninth transistor M9 may have a control terminal coupled to a second terminal of the tenth transistor M10, a first terminal coupled to the second voltage signal terminal VGH, and a second terminal coupled to the pull-down node PD. The tenth transistor M10 may have a control terminal and a first terminal coupled to the second voltage signal terminal VGH. In some embodiments, the second pull-down node control sub-circuit 470 may comprise an eleventh transistor M11 and a twelfth transistor M12. The eleventh transistor M11 may have a control terminal coupled to the pull-up node PU, a first terminal coupled to the pull-down node PD, and a second terminal coupled to the first voltage signal terminal VGL. The twelfth transistor M12 may have a control terminal coupled to the pull-up node PU, a first terminal coupled to the control terminal of the ninth transistor M9, and a second terminal coupled to the first voltage signal terminal VGL.

In addition, in the embodiment shown in FIG. 5, if all the transistors in the shift register 400 are N-type transistors, the first voltage signal from the first voltage signal terminal VGL may be a low level signal and the second voltage signal from the second voltage signal terminal VGH may be a high level signal.

It can be understood by those skilled in the art that the specific structure of the register 400 shown in FIG. 4 is not limited to the specific structure shown in FIG. 5, and may use any appropriate circuit design. For example, in the input sub-circuit 410, the following configuration may be used: the input terminal INPUT is coupled to the control terminal of the fourth transistor M4, the second voltage signal terminal VGH or another voltage signal terminal is coupled to the first terminal of the fourth transistor M4, and the pull-up node PU is coupled to the second terminal of the fourth transistor M4. With this configuration, functions of the input sub-circuit 410 shown in FIG. 4 can also be implemented. Different designs may also be used for all or a part of other sub-circuits.

Figure 6:
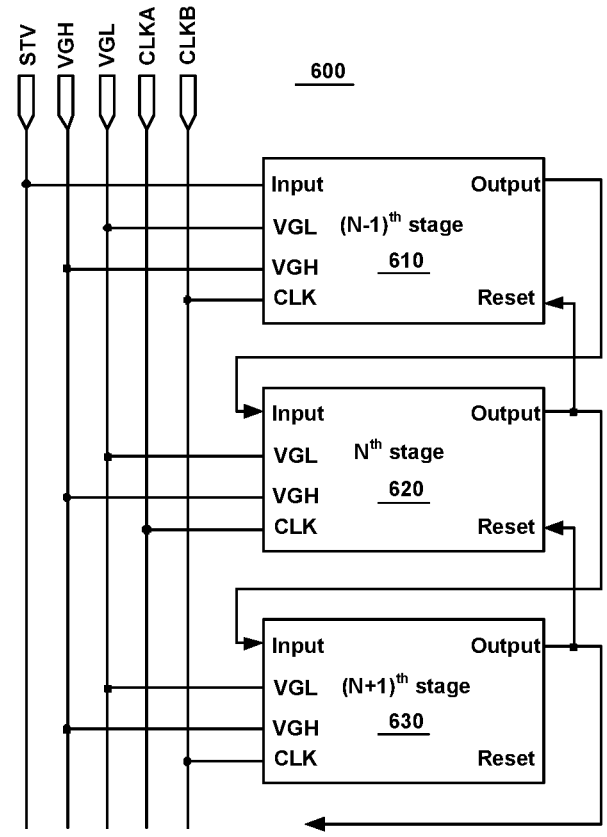
FIG. 6 is a diagram illustrating an exemplary structure of a gate driving circuit according to an embodiment of the present disclosure.

Next, a diagram of an exemplary structure of a gate driving circuit according to an embodiment of the present disclosure will be described with reference to FIG. 6. FIG. 6 is a diagram illustrating an exemplary structure of a gate driving circuit 600 according to an embodiment of the present disclosure. The gate driving circuit 600 may comprise a plurality of cascaded shift registers 610, 620, 630 etc. Although only three shift registers are shown in the embodiment shown in FIG. 6, the embodiments of the present disclosure are not limited thereto, and any number of shift registers may be used. In some embodiments, each of the shift registers shown in FIG. 6 may be the shift register 100 shown in FIG. 1, the shift register 300 shown in FIG. 3, or the shift register 400 shown in FIGS. 4 and 5; however, the present disclosure is not limited thereto. In some other embodiments, in the gate driving circuit 600 shown in FIG. 6, a part of the shift registers may be implemented by the shift register 100, 300 and/or 400 according to the embodiment of the present disclosure, and another part of the shift registers may be implemented by other shift registers which exist or will be developed in the future.

As shown in FIG. 6, each shift register (for example, an $N^{th}$ stage of shift register 620) has an input terminal INPUT (N) coupled to an output terminal OUTPUT(N−1) of a previous stage of shift register (for example, an $(N−1)^{th}$ stage of shift register 610), an output terminal OUTPUT(N) coupled to an input terminal INPUT(N+1) of a next stage of shift register (for example, an $(N+1)^{th}$ stage of shift register 630) and a reset signal terminal RESET(N−1) of the previous stage of shift register (for example, the $(N−1)^{th}$ stage of shift register 610), and a reset signal terminal RESET(N) coupled to an output terminal OUTPUT(N+1) of the next stage of shift register (for example, the $(N+1)^{th}$ stage of shift register 630). In addition, an input terminal INPUT of a first stage of shift register may be, for example, connected to an STV signal line to receive an STV signal indicating start of scanning of a frame picture.

In addition, as shown in FIG. 6, clock signal terminals CLK of two adjacent shift registers (for example, the $N^{th}$ stage of shift register 620 and the $(N−1)^{th}$ stage of shift register 610 or the $(N+1)^{th}$ stage of shift register 630) may be coupled to different clock signal lines CLKA and CLKB. In some embodiments, CLKA and CLKB may provide clock signals with a waveform difference of, for example, one half clock period (with a phase difference of nn). For example, the clock signal terminal CLK of the $N^{th}$ stage of shift register 620 is coupled to the CLKA line, and the clock signal terminals CLK of the $(N−1)^{th}$ stage of shift register 610 and the $(N+1)^{th}$ stage of shift register 630 are coupled to the CLKB line, so that an operation timing shown FIG. 2 or FIG. 7 can be realized. In addition, as also shown in FIG. 6, a first voltage signal terminal VGL and a second voltage signal terminal VGH of each shift register may be coupled to the VGL line and the VGH line respectively to receive a first voltage signal and a second voltage signal respectively.

An operation timing of the shift register 400 will be described in detail below with reference to FIG. 7 in conjunction with FIGS. 4 to 6.

Figure 7:
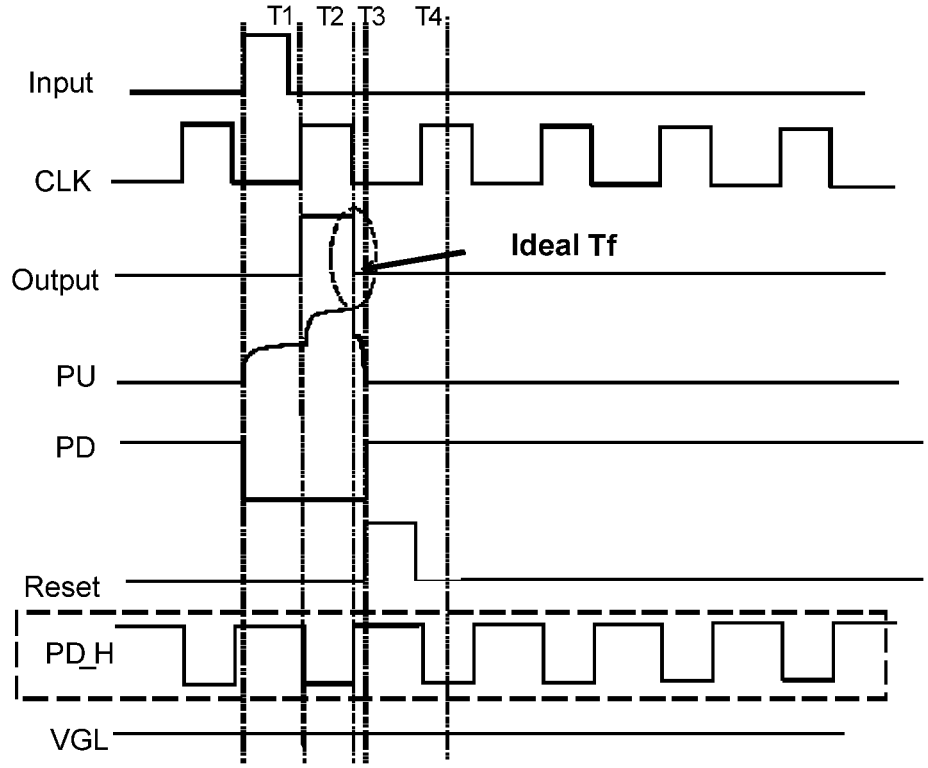
FIG. 7 is a diagram illustrating an exemplary operation timing of the shift register shown in FIG. 4.

FIG. 7 is diagram illustrating an exemplary operation timing of the shift register 400 shown in FIG. 4. As shown in FIG. 7, in a first phase T1, due to an output signal (or an STV signal) from a previous stage of shift register, an input signal at a high level is input to the input terminal INPUT of the shift register 400, so that the fourth transistor M4 is turned on and a level at the pull-up node PU gradually increases. As the level at the pull-up node PU increases, the eleventh transistor M11 and the twelfth transistor M12 are turned on and a level at the pull-down node PD decreases. At the same time, current of the input signal charges a capacitor C and forms a voltage difference between a first terminal and a second terminal of the capacitor C. At this time, as a clock signal at a low level is input to the clock signal terminal CLK, in a case that the sixth transistor M6 is turned on by the high level at the pull-up node PU, the clock signal at a low level from the clock signal terminal CLK is output to the output terminal OUTPUT.

In a second phase T2, an input signal at a low level is input to the input terminal INPUT, a clock signal at a high level is input to the clock signal terminal CLK, and a first voltage signal at a low level is input to the first voltage signal terminal. At this time, as the output terminal OUTPUT becomes outputting the clock signal at a high level, the second terminal of the capacitor C which is coupled to the output terminal OUTPUT also becomes a high level. At this time, due to the bootstrap action of the capacitor C, a voltage of the first terminal of the capacitor C further increases, so that the sixth transistor M6 continues to remain in a turn-on state and the clock signal at a high level continues to be output.

In a third phase T3, an input signal at a low level is input to the input terminal INPUT, a clock signal at a low level is input to the clock signal terminal CLK, and a first voltage signal at a low level is input to the first voltage signal terminal. At this time, unlike the operation timing of the shift register 100 shown in FIG. 2, the first transistor M1 is turned off under control of the clock signal at a low level, so that the control terminal of the second transistor M2 is completely controlled by the second terminal of the third transistor M3. As the control terminal and the first terminal of the third transistor M3 are always coupled to the second voltage signal terminal VGH which provides a second voltage signal at a high level, the second terminal of the third transistor M3 is at a high level at this time, so that the second transistor M3 is turned on. Thereby, the first voltage signal at a low level from the first voltage signal terminal VGL is transmitted to the output terminal OUTPUT. In this way, it avoids the problem that the output signal cannot be completely de-noised before a reset signal from a next stage of shift register arrives.

In remaining time of one frame (for example, including but not limited to a T4 phase), an input signal at a low level is input to the input terminal INPUT, a clock signal at a high level or a low level is input to the clock signal terminal CLK, and a first voltage signal at a low level is input to the first voltage signal terminal. At this time, due to the arrival of the reset signal, the fifth transistor M5 is turned on, so that the level at the pull-up node PU decreases, and thereby the eleventh transistor M11 and the twelfth transistor M12 are turned off. As a result, the ninth transistor M9 is controlled solely by the tenth transistor M10, so that the pull-down node PD becomes a high level, and thereby the eighth transistor M8 is turned on, to finally pull down the output signal from the output terminal OUTPUT to a low level (VGL). Before an input signal at a high level arrives in a next frame, as the pull-up node PU may no longer be pulled up, the output signal will always remain at a low level.

Therefore, as shown in FIG. 7, the shift register 400 can sufficiently de-noise the output signal in a case that the duty cycle of the clock signal is less than 50%, so as to rapidly pull down the output signal to a low level in a short time, i.e., during the T3 phase, thereby avoiding errors in a display picture. Further, alternatively or additionally, the shift register 400 is also applicable to a clock signal with a duty cycle equal to 50%.

Next, an exemplary driving method of a shift register (for example, the shift register 400) will be described in detail with reference to FIG. 8.

Figure 8:
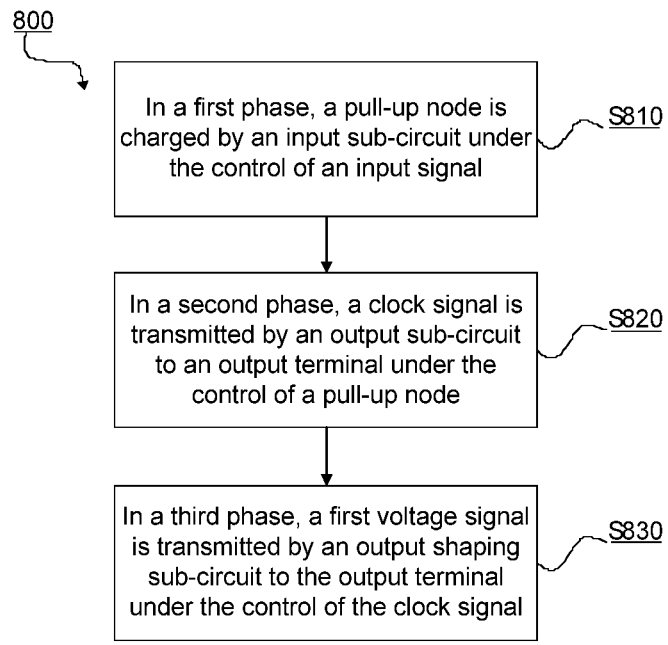
FIG. 8 is a flowchart illustrating an exemplary driving method of a shift register according to an embodiment of the present disclosure.

FIG. 8 is a flowchart illustrating an exemplary driving method 800 of a shift register (for example, the shift register 400) according to an embodiment of the present disclosure. As shown in FIG. 8, the method 800 may comprise steps S810, S820 and S830. According to some embodiments of the present disclosure, some steps of the method 800 may be performed individually or in combination, and may be performed in parallel or sequentially, which is not limited to a specific operation order shown in FIG. 8.

The method 800 may start at step S810. In step S810, in a first phase, a pull-up node (for example, the pull-up node PU) is charged by an input sub-circuit (for example, the input sub-circuit 410) under control of an input signal (for example, an input signal from the input terminal INPUT).

In step S820, in a second phase, a clock signal (for example, a clock signal from the clock signal terminal CLK) is transmitted by an output sub-circuit (for example, the output sub-circuit 420) to an output terminal (for example, the output terminal OUTPUT shown in FIG. 4) under control of a pull-up node (for example, the pull-up node PU).

In step S830, in a third phase, a first voltage signal (for example, VGL shown in FIG. 4) is transmitted by an output shaping sub-circuit (for example, the output shaping sub-circuit 480) to the output terminal (for example, the output terminal OUTPUT shown in FIG. 4) under control of the clock signal (for example, the clock signal from the clock signal terminal CLK).

The driving method of the shift register 400 will be described in detail below by taking the shift register 400 shown in FIG. 4 as an example, and the following description will be given by taking the transistors in the shift register 400 being N-type transistors as an example. However, the present disclosure is not limited thereto.

In the first phase T1, an input signal at a high level is input to the input terminal INPUT of the shift register 400, a clock signal at a low level is input to the clock signal terminal CLK, and a first voltage signal at a low level is input to the first voltage signal terminal VGL, so that an output signal at a low level is output by the output terminal OUTPUT.

In the second phase T2, an input signal at a low level is input to the input terminal INPUT of the shift register 400, a clock signal at a high level is input to the clock signal terminal CLK, and a first voltage signal at a low level is input to the first voltage signal terminal VGL, so that an output signal at a high level is output by the output terminal OUTPUT.

In the third phase T3, an input signal at a low level is input to the input terminal INPUT of the shift register 400, a clock signal at a low level is input to the clock signal terminal CLK, and a first voltage signal at a low level is input to the first voltage signal terminal VGL, so that an output signal at a low level is output by the output terminal OUTPUT.

In remaining time of one frame (including the fourth phase T4), an input signal at a low level may be input to the input terminal INPUT of the shift register 400, a clock signal at a high level or a low level may be input to the clock signal terminal CLK, and a first voltage signal at a low level may be input to the first voltage signal terminal VGL, so that an output signal at a low level is output by the output terminal OUTPUT.

Therefore, the output signal can be pulled down to a low level at the moment when the clock signal becomes a low level by using the shift registers 300 and/or 400 and corresponding driving methods thereof according to the embodiments of the present disclosure. This solves the problem that some gate driving circuits cannot rapidly pull down a gate voltage to a low level in the T3 phase, which occupies, for example, 5% of a cycle, which results in a too large gate driving voltage Tf, thereby causing insufficient charging and false output.

The present disclosure has heretofore been described in connection with the preferred embodiments. It should be understood that various other changes, substitutions and additions can be made by those skilled in the art without departing from the spirit and scope of the present disclosure. Therefore, the scope of the present disclosure is not limited to the specific embodiments described above, but should be defined by the appended claims.

In addition, functions which are described herein as being implemented by pure hardware, pure software, and/or firmware may also be implemented by dedicated hardware, a combination of general hardware and software etc. For example, functions which are described as being implemented by dedicated hardware (for example, Field Programmable Gate Array (FPGA), Application Specific Integrated Circuit (ASIC), etc.) may also be implemented by a combination of general purpose hardware (for example, Central Processing Unit (CPU), Digital Signal Processor (DSP)) and software, and vice versa.

We claim:

1. A shift register, comprising:
   an input sub-circuit coupled to an input terminal and a pull-up node, and configured to charge the pull-up node under control of an input signal from the input terminal;
   an output sub-circuit coupled to a clock signal terminal, the pull-up node, and an output terminal, and configured to transmit a clock signal from the clock signal terminal to the output terminal under control of the pull-up node; and
   an output shaping sub-circuit coupled to the clock signal terminal, the output terminal, and a first voltage signal terminal, and configured to transmit a first voltage signal from the first voltage signal terminal to the output terminal under control of the clock signal,
   wherein the output shaping sub-circuit comprises a first transistor, a second transistor and a third transistor,
   wherein a control terminal of the first transistor is coupled to the clock signal terminal, a first terminal of the first transistor is coupled to a reference node, and a second terminal of the first transistor is coupled to the first voltage signal terminal,
   wherein a control terminal of the second transistor is coupled to the reference node, a first terminal of the second transistor is coupled to the first voltage signal terminal, and a second terminal of the second transistor is coupled to the output terminal, and
   wherein a control terminal and a first terminal of the third transistor are coupled to a second voltage signal terminal, and a second terminal of the third transistor is coupled to the reference node,
   wherein in response to the clock signal being at a high level, the second transistor is controlled by only the first transistor, and the first voltage signal from the first voltage signal terminal is transmitted by the first transistor to the control terminal of the second transistor through the reference node,
   wherein in response to the clock signal being at a low level, the second transistor is controlled by only the third transistor, and a second voltage signal from the second voltage signal terminal is transmitted by the third transistor to the control terminal of the second transistor through the reference node, and
   wherein a turn-on resistance of the first transistor is less than that of the third transistor, and the reference node is only coupled to the first terminal of the first transistor, the control terminal of the second transistor and the second terminal of the third transistor, and is arranged separately from a portion, other than the output shaping sub-circuit, of the shift register, so that in response to the clock signal being at a high level, a potential at the reference node is only controlled by the first transistor, and in response to the clock signal being at a low level, a potential at the reference node is only controlled by the third transistor.

2. The shift register according to claim 1, further comprising:
   a reset sub-circuit coupled to a reset signal terminal, the pull-up node, and the first voltage signal terminal, and configured to provide the first voltage signal from the first voltage signal terminal to the pull-up node under control of a reset signal from the reset signal terminal;
   a pull-up node control sub-circuit coupled to the pull-up node, a pull-down node and the first voltage signal terminal, and configured to provide the first voltage signal from the first voltage signal terminal to the pull-up node under control of the pull-down node;
   a pull-down control sub-circuit coupled to the pull-down node, the first voltage signal terminal and the output terminal, and configured to provide the first voltage signal from the first voltage signal terminal to the output terminal under control of the pull-down node;
   a first pull-down node control sub-circuit coupled to the pull-down node and the second voltage signal terminal, and configured to provide the second voltage signal from the second voltage signal terminal to the pull-down node; and
   a second pull-down node control sub-circuit coupled to the pull-up node, the pull-down node, and the first voltage signal terminal, and configured to provide the first voltage signal from the first voltage signal terminal to the pull-down node under control of the pull-up node.

3. The shift register according to claim 1, wherein the input sub-circuit comprises a fourth transistor, wherein:
   a control terminal and a first terminal of the fourth transistor are coupled to the input terminal, and a second terminal of the fourth transistor is coupled to the pull-up node.

4. The shift register according to claim 2, wherein the reset sub-circuit comprises a fifth transistor, wherein:
   a control terminal of the fifth transistor is coupled to the reset signal terminal, a first terminal of the fifth transistor is coupled to the pull-up node, and a second terminal of the fifth transistor is coupled to the first voltage signal terminal.

5. The shift register according to claim 1, wherein the output sub-circuit comprises a sixth transistor and a first capacitor, wherein:
   a control terminal of the sixth transistor is coupled to the pull-up node, a first terminal of the sixth transistor is coupled to the clock signal terminal, and a second terminal of the sixth transistor is coupled to the output terminal; and a first terminal of the first capacitor is coupled to the pull-up node, and a second terminal of the first capacitor is coupled to the output terminal.

6. The shift register according to claim 2, wherein the pull-up node control sub-circuit comprises a seventh transistor, wherein:
a control terminal of the seventh transistor is coupled to the pull-down node, a first terminal of the seventh transistor is coupled to the pull-up node, and a second terminal of the seventh transistor is coupled to the first voltage signal terminal.

7. The shift register according to claim 2, wherein the pull-down control sub-circuit comprises an eighth transistor, wherein:
a control terminal of the eighth transistor is coupled to the pull-down node, a first terminal of the eighth transistor is coupled to the output terminal, and a second terminal of the eighth transistor is coupled to the first voltage signal terminal.

8. The shift register according to claim 2, wherein the first pull-down node control sub-circuit comprises a ninth transistor and a tenth transistor, wherein:
a control terminal of the ninth transistor is coupled to a second terminal of the tenth transistor, a first terminal of the ninth transistor is coupled to the second voltage signal terminal, and a second terminal of the ninth transistor is coupled to the pull-down node; and
a control terminal and a first terminal of the tenth transistor are coupled to the second voltage signal terminal.

9. The shift register according to claim 8, wherein the second pull-down node control sub-circuit comprises an eleventh transistor and a twelfth transistor, wherein:
a control terminal of the eleventh transistor is coupled to the pull-up node, a first terminal of the eleventh transistor is coupled to the pull-down node, and a second terminal of the eleventh transistor is coupled to the first voltage signal terminal; and
a control terminal of the twelfth transistor is coupled to the pull-up node, a first terminal of the twelfth transistor is coupled to the control terminal of the ninth transistor, and a second terminal of the twelfth transistor is coupled to the first voltage signal terminal.

10. The shift register according to claim 2, wherein all transistors of the sub-circuits are N-type transistors, the first voltage signal is a low level signal and the second voltage signal is a high level signal.

11. A gate driving circuit comprising a plurality of cascaded shift registers according to claim 1.

12. A display apparatus comprising the gate driving circuit according to claim 11.

13. A driving method of the shift register according to claim 1, comprising:
in a first phase, charging, by the input sub-circuit, the pull-up node under control of the input signal;
in a second phase, transmitting, by the output sub-circuit, the clock signal to the output terminal under control of the pull-up node; and
in a third phase, transmitting, by the output shaping sub-circuit, the first voltage signal to the output terminal under control of the clock signal.

14. The method of claim 13, wherein a sum of the first phase, the second phase, and the third phase is approximately equal to one clock cycle.

15. A gate driving circuit comprising a plurality of cascaded shift registers according to claim 2.

16. A display apparatus comprising the gate driving circuit according to claim 15.

17. A driving method of the shift register according to claim 2, comprising:
in a first phase, charging, by the input sub-circuit, the pull-up node under control of the input signal;
in a second phase, transmitting, by the output sub-circuit, the clock signal to the output terminal under control of the pull-up node; and
in a third phase, transmitting, by the output shaping sub-circuit, the first voltage signal to the output terminal under control of the clock signal.

18. The method according to claim 17, wherein a sum of the first phase, the second phase, and the third phase is approximately equal to one clock cycle.

19. A gate driving circuit comprising a plurality of cascaded shift registers according to claim 3.

20. A shift register, comprising:
an input sub-circuit coupled to an input terminal and a pull-up node, and configured to charge the pull-up node under control of an input signal from the input terminal;
an output sub-circuit coupled to a clock signal terminal, the pull-up node, and an output terminal, and configured to transmit a clock signal from the clock signal terminal to the output terminal under control of the pull-up node; and
an output shaping sub-circuit coupled to the clock signal terminal, the output terminal, and a first voltage signal terminal, and configured to transmit a first voltage signal from the first voltage signal terminal to the output terminal under control of the clock signal,
wherein the output shaping sub-circuit comprises a first transistor, a second transistor and a third transistor;
wherein a control terminal of the first transistor is coupled to the clock signal terminal, a first terminal of the first transistor is coupled to a reference node, and a second terminal of the first transistor is coupled to the first voltage signal terminal;
wherein a control terminal of the second transistor is coupled to the reference node, a first terminal of the second transistor is coupled to the first voltage signal terminal, and a second terminal of the second transistor is coupled to the output terminal; and
wherein a control terminal and a first terminal of the third transistor are coupled to a second voltage signal terminal, and a second terminal of the third transistor is coupled to the reference node,
wherein in response to the clock signal being at a high level, the second transistor is controlled by only the first transistor, and the first voltage signal from the first voltage signal terminal is transmitted by the first transistor to the control terminal of the second transistor through the reference node; and
wherein in response to the clock signal being at a low level, the second transistor is controlled by only the third transistor, and a second voltage signal from the second voltage signal terminal is transmitted by the third transistor to the control terminal of the second transistor through the reference node,
wherein the shift register further comprises:
a reset sub-circuit coupled to a reset signal terminal, the pull-up node, and the first voltage signal terminal, and configured to provide the first voltage signal from the first voltage signal terminal to the pull-up node under control of a reset signal from the reset signal terminal;
a pull-up node control sub-circuit coupled to the pull-up node, a pull-down node and the first voltage signal terminal, and configured to provide the first voltage signal from the first voltage signal terminal to the pull-up node under control of the pull-down node;

a pull-down control sub-circuit coupled to the pull-down node, the first voltage signal terminal and the output terminal, and configured to provide the first voltage signal from the first voltage signal terminal to the output terminal under control of the pull-down node;

a first pull-down node control sub-circuit coupled to the pull-down node and the second voltage signal terminal, and configured to provide a second voltage signal from the second voltage signal terminal to the pull-down node; and a second pull-down node control sub-circuit coupled to the pull-up node, the pull-down node, and the first voltage signal terminal, and configured to provide the first voltage signal from the first voltage signal terminal to the pull-down node under control of the pull-up node, wherein the input sub-circuit comprises a fourth transistor, a control terminal and a first terminal of the fourth transistor being coupled to the input terminal, and a second terminal of the fourth transistor being coupled to the pull-up node;

wherein the reset sub-circuit comprises a fifth transistor, a control terminal of the fifth transistor being coupled to the reset signal terminal, a first terminal of the fifth transistor being coupled to the pull-up node, and a second terminal of the fifth transistor being coupled to the first voltage signal terminal;

wherein the output sub-circuit comprises a sixth transistor and a first capacitor, a control terminal of the sixth transistor being coupled to the pull-up node, a first terminal of the sixth transistor being coupled to the clock signal terminal, a second terminal of the sixth transistor being coupled to the output terminal, a first terminal of the first capacitor being coupled to the pull-up node, and a second terminal of the first capacitor being coupled to the output terminal;

wherein the pull-up node control sub-circuit comprises a seventh transistor, a control terminal of the seventh transistor being coupled to the pull-down node, a first terminal of the seventh transistor being coupled to the pull-up node, and a second terminal of the seventh transistor being coupled to the first voltage signal terminal;

wherein the pull-down control sub-circuit comprises an eighth transistor, a control terminal of the eighth transistor being coupled to the pull-down node, a first terminal of the eighth transistor being coupled to the output terminal, and a second terminal of the eighth transistor being coupled to the first voltage signal terminal;

wherein the first pull-down node control sub-circuit comprises a ninth transistor and a tenth transistor, a control terminal of the ninth transistor being coupled to a second terminal of the tenth transistor, a first terminal of the ninth transistor being coupled to the second voltage signal terminal, a second terminal of the ninth transistor being coupled to the pull-down node, and a control terminal and a first terminal of the tenth transistor being coupled to the second voltage signal terminal;

wherein the second pull-down node control sub-circuit comprises an eleventh transistor and a twelfth transistor, a control terminal of the eleventh transistor being coupled to the pull-up node, a first terminal of the eleventh transistor being coupled to the pull-down node, a second terminal of the eleventh transistor being coupled to the first voltage signal terminal, a control terminal of the twelfth transistor being coupled to the pull-up node, a first terminal of the twelfth transistor being coupled to the control terminal of the ninth transistor, and a second terminal of the twelfth transistor being coupled to the first voltage signal terminal; and wherein a turn-on resistance of the first transistor is less than that of the third transistor, and the reference node is only coupled to the first terminal of the first transistor, the control terminal of the second transistor and the second terminal of the third transistor, and is arranged separately from a portion, other than the output shaping sub-circuit, of the shift register, so that in response to the clock signal being at a high level, a potential at the reference node is only controlled by the first transistor, and in response to the clock signal being at a low level, a potential at the reference node is only controlled by the third transistor.

\* \* \* \* \*